(12) United States Patent
Lowney et al.

(10) Patent No.: US 9,000,812 B1
(45) Date of Patent: Apr. 7, 2015

(54) CURRENT STEERING WITH INDEPENDENT BIASING BETWEEN BLEED AND STEERING CIRCUITRY

(71) Applicant: Xilinx, Inc., San Jose, CA (US)

(72) Inventors: Donnacha Lowney, Dublin (IE); Christophe Erdmann, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/245,540

(22) Filed: Apr. 4, 2014

(51) Int. Cl.
*H03B 1/00* (2006.01)
*H03K 17/16* (2006.01)

(52) U.S. Cl.
CPC .................................. *H03K 17/162* (2013.01)

(58) Field of Classification Search
CPC .................................................. H03K 17/162
USPC ......... 327/543, 103, 108, 109, 110, 111, 403, 327/404, 407, 408; 341/126, 133, 136, 155
See application file for complete search history.

(56) References Cited

U.S. PATENT DOCUMENTS 4,987,327 A * 1/1991 Fernandez et al. ............ 327/543

OTHER PUBLICATIONS

Lin, C-H, et al., "A 12b 2.9GS/s DAC with IM3 <-60dBc Beyond 1GHz in 65nm CMOS," *Digest of Technical Papers, 2009 IEEE International Solid-State Circuits Conference*, Feb. 8, 2009, pp. 74-75 plus supplement page, IEEE, Piscataway, New Jersey, USA.
Wu, X. et al., "Output impedance analysis of digital-to-analogue converters", *Electronics Letters*, Nov. 24, 2011, pp. 1-2, vol. 47, No. 24, IEEE, Piscataway, New Jersey, USA.

* cited by examiner

*Primary Examiner* — Jung Kim
(74) *Attorney, Agent, or Firm* — W. Eric Webostad

(57) ABSTRACT

An apparatus relating generally to a current steering cell includes a first bleeder circuit, a second bleeder circuit, a steering circuit, and an output circuit. The first bleeder circuit and the second bleeder circuit are coupled to receive a first current-source bias voltage. The steering circuit is coupled to receive a second current-source bias voltage independent from the first current-source bias voltage.

10 Claims, 9 Drawing Sheets

US 9,000,812 B1

CURRENT STEERING WITH INDEPENDENT BIASING BETWEEN BLEED AND STEERING CIRCUITRY

TECHNICAL FIELD

The following description relates to integrated circuit devices ("ICs"). More particularly, the following description relates to a current steering with independent biasing between bleed and steering circuitry for an IC.

BACKGROUND

Current steering digital-to-analog converters ("DACs") have parasitic capacitances at output cascodes that are maintained in a charged state by the use of a "bleed" current. Conventionally, this bleed current is a fixed scaled version of an output full scale current.

It would be desirable and useful to control bleed current independently of the full scale current to enhance system power usage, enhance performance, and/or reduce die area usage.

SUMMARY

An apparatus relates generally to a current steering cell. In such an apparatus, the current steering cell includes a first bleeder circuit, a second bleeder circuit, a steering circuit, and an output circuit. The first bleeder circuit and the second bleeder circuit are coupled to receive a first current-source bias voltage. The steering circuit is coupled to receive a second current-source bias voltage independent from the first current-source bias voltage.

An apparatus relates generally to a plurality of current steering cells. In such an apparatus, the plurality of current steering cells is coupled to a plurality of current source supplies. The plurality of current source supplies includes a first bias voltage generator and a second bias voltage generator. Each of the plurality of current steering cells includes a first bleeder circuit, a second bleeder circuit, a steering circuit, and an output circuit. The first bleeder circuit and the second bleeder circuit of each of the plurality of current steering cells is coupled to receive a first common current-source bias voltage from the first bias voltage generator. The steering circuit of each of the plurality of current steering cells is coupled to receive a second common current-source bias voltage from the second bias voltage generator.

An apparatus relates generally to a plurality of current steering cells. In such an apparatus, the plurality of current steering cells is coupled to a plurality of current source supplies. The plurality of current source supplies includes a plurality of bias voltage generators for respectively generation a plurality of current-source bias voltages. The plurality of current source supplies includes a bias voltage generator for generation of a common current-source bias voltage. Each of the plurality of current steering cells includes a first bleeder circuit, a second bleeder circuit, a steering circuit, and an output circuit. The first bleeder circuit and the second bleeder circuit of each of the plurality of current steering cells is coupled to respectively receive the plurality of current-source bias voltages from the plurality of bias voltage generators. The steering circuit of each of the plurality of current steering cells is coupled to receive the common current-source bias voltage from the common bias voltage generator.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIGS. 2-1 and 2-2 are respective block/circuit diagrams depicting other exemplary current steering systems.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Current steering digital-to-analog converters ("DACs") have parasitic capacitances at output cascodes that are maintained in a charged state by the use of a "bleed" current. Conventionally, this bleed current is a fixed scaled version of an output full scale current. However, as described below in additional detail, bleed current is controlled independently as between a full scale current and a bleed current to enhance system power usage, enhance performance, and/or reduce die area usage. Along those lines, biasing of bleeder circuits and a steering circuit of a current steering cell are separately controlled and/or provided to provide such independence.

With the above general understanding borne in mind, various configurations for current steering systems are generally described below.

Figure 1:
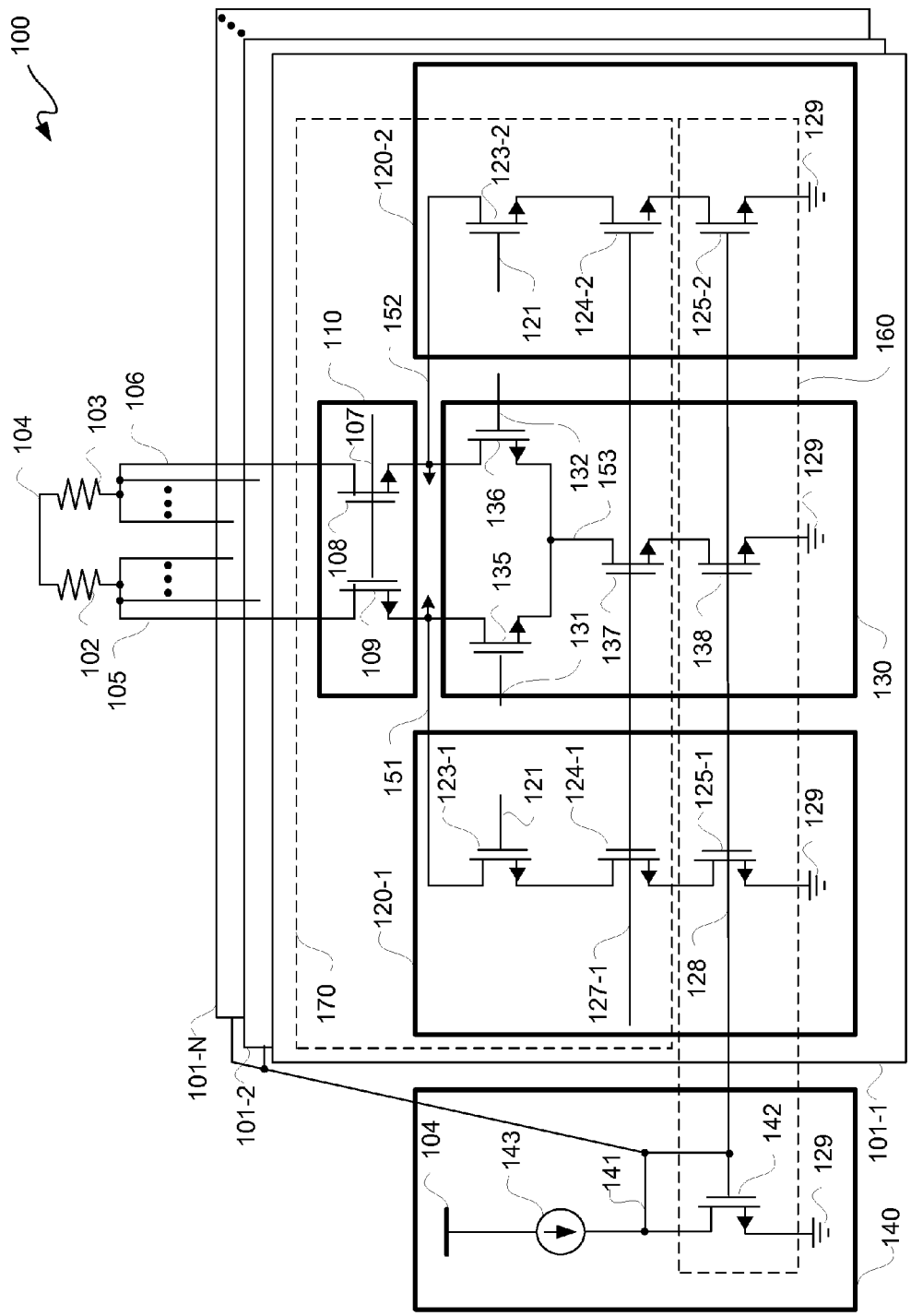
FIG. 1 is a block/circuit diagram depicting an exemplary current steering system.

FIG. 1 is a block/circuit diagram depicting an exemplary current steering system 100. Current steering system 100 may be included in a current steering digital-to-analog converter ("DAC"), for example.

Current steering system 100 includes from 1 to N, for N a positive integer greater than 1, current steering cells. In this example, current steering cells 101-1 through 101-N (collectively and singly "101") are illustratively depicted coupled to a common termination voltage supply bus 104. Current steering cells 101-1 through 101-N may each be coupled to termination voltage supply bus 104 through a common positive-side impedance and a common negative-side impedance via common voltage sources nodes 105 and 106, respectively, of each of current steering cells 101-1 through 101-N. In this example, a positive-side impedance is generally depicted as a resistor 102, and a negative-side impedance is generally depicted as a resistor 103. For example, a number N of current steering cells 101-1 through 101-N may be coupled in parallel to termination resistors, such as resistors 102 and 103. While current steering cells 101-1 through 101-N, as well as current source supply or bias voltage generator 140, may be located on a same die, such as an FPGA or any other IC for example, and resistors 102 and 103 may be coupled externally to such a die.

Each cell of current steering cells 101-1 through 101-N may include a positive-side bleeder circuit 120-1, a negative-side bleeder circuit 120-2, current steering circuit 130, and an output circuit 110. Each cell of current steering cells 101-1 through 101-N may be coupled to a common bias voltage generator 140. For purposes of clarity by way of example and not limitation, current steering cell 101-1 is described in additional detail with the understanding that each of current steering cells 101-1 through 101-N may likewise be configured.

Output circuit 110 includes NMOS transistors 108 and 109. NMOS transistors 108 and 109 are commonly gated to receive an output cascode bias voltage 107. Even though only NMOS transistors are described below, such as for current steering system 100 for a single or same polarity, in another configuration only PMOS or a combination of p- and n-types of switches may be used. Additionally, it should be understood that each current steering cell 101 is of a cascode configuration.

A drain node of NMOS transistor 108 is coupled to common voltage source node 106 on a negative side of current steering cell 101-1, and a drain node of NMOS transistor 109 is coupled to common voltage source node 105 on a positive side of current steering cell 101-1.

A source node of NMOS transistor 108 is coupled to a negative-side output node 152 on a negative side of current steering cell 101-1, and a source node of NMOS transistor 109 is coupled to a positive-side output node 151 on a positive side of current steering cell 101-1.

Bias voltage generator 140 may include a reference current source 143 coupled between a common termination supply ("supply voltage node or bus") 104 and a bias voltage output node 141. A drain node of NMOS transistor 142 of bias voltage generator 140 may be coupled to bias voltage output node 141. A source node of NMOS transistor 142 may be coupled to a ground node or bus 129. A gate of NMOS transistor 142 is likewise coupled to bias voltage output node 141, and bias voltage output node 141 is coupled to gates of current source bias voltage transistors 125-1, 125-2 and transistor 138 of each cell of current steering cells 101-1 through 101-N. NMOS transistor 142 is a diode coupled transistor to provide a bias diode transistor. Current passing through transistor 142 may thus be mirrored in current source transistor 138 in proportion to the ratio of device sizes.

Current steering circuit 130 may be commonly coupled with output circuit 110 at output nodes 151 and 152. A positive-side bleeder circuit 120-1 is commonly coupled with current steering circuit 130 and output circuit 110 at positive-side output node 151, and a negative-side bleeder circuit 120-2 is commonly coupled with current steering circuit 130 and output circuit 110 at negative-side output node 152.

Current steering circuit 130 includes NMOS transistors 135 through 138. A drain node of NMOS transistor 135 is coupled to output node 151, and a drain node of NMOS transistor 136 is coupled to output node 152. A gate of NMOS transistor 135 is coupled to receive positive-side data signal 131, and a gate of NMOS transistor 136 is coupled to receive negative-side data signal 132. Source nodes of NMOS transistors 135 and 136 are commonly coupled at internal current steering node 153. NMOS transistors 135 and 136 respectively are a positive-side switch and a negative-side switch of current steering circuit 130.

A drain node of cascode NMOS transistor 137 is coupled to internal current steering node 153, and a source node of NMOS transistor 137 and a drain node of NMOS transistor 138 are coupled in source-drain series. A gate of NMOS transistor 137 may be coupled to receive a cascode bias voltage 127-1. N separate cascode bias voltages 127-1 through 127-N may be respectively provided to each cascode transistor 137 for each cell of current steering cells 101-1 through 101-N.

A source node of NMOS transistor 138 is coupled to ground node or bus 129. A gate of NMOS transistor 138, which may be thought of as a current source transistor, may be coupled to bias voltage output node 141 to receive a current source bias voltage 128.

Positive-side bleeder circuit 120-1 includes NMOS transistors 123-1, 124-1, and 125-1. Negative-side bleeder circuit 120-2 includes NMOS transistors 123-2, 124-2, and 125-2. A drain node of NMOS transistor 123-1 is coupled to output node 151, and a drain node of NMOS transistor 123-2 is coupled to output node 152. A gate of bleeder switch NMOS transistor 123-1 is coupled to receive a bleeder switch bias voltage 121, and a gate of bleeder switch NMOS transistor 123-2 is coupled to receive bleeder switch bias voltage 121. Gates of bleeder switch transistors may be coupled to a logic high level for high-speed operation, namely for example data rates greater than approximately 1 Giga-sample per second for 12-bit resolution current steering DACs; however, for low-speed operation, bleeder circuits 120-1 and 120-2 may be decoupled from ground node or bus 129 by providing a logic low level to such bleeder switch transistors, or more generally to any one or more transistors of bleeder circuits 120-1 and 120-2.

A source node of NMOS transistor 123-1 is coupled to a drain node of cascode bleeder NMOS transistor 124-1, and source node of NMOS transistor 123-2 is coupled to a drain node of cascode bleeder NMOS transistor 124-2. A gate of cascode bleeder NMOS transistor 124-1 and a gate of cascode bleeder NMOS transistor 124-2 may be coupled to receive a cascode bias voltage 127-1. N separate cascode bias voltages 127-1 through 127-N may be respectively provided to each cascode transistor 124-1 and 124-2 for each cell of current steering cells 101-1 through 101-N.

For a size restricted application, bleeder switch transistors 123-1 and 123-2 and/or bleeder cascode transistors 124-1 and 124-2 may be omitted, though possibly with some degradation in performance due to increased voltage variation on output nodes 151 and 152. However, for purposes of clarity, it shall be assumed that transistors 123-1, 123-2, 124-1, and 124-2 are present.

A drain node of current source bleeder transistor 125-1 may be coupled to a source node of cascode bleeder NMOS transistor 124-1, and a drain node of current source bleeder transistor 125-2 may be coupled to a source node of cascode bleeder NMOS transistor 124-2. A source node of each of NMOS transistors 125-1 and 125-2 is coupled to ground node or bus 129. A gate of each of NMOS transistors 125-1 and 125-2, which may be thought of as current steering bleeder transistors, may be coupled to bias voltage output node 141 to receive a current source bias voltage 128.

A "bleed" current may be used to maintain a charge state of parasitic capacitances associated with output circuit 110. For purposes of clarity by way of example and not limitation, the following description is in terms of a current steering DAC. However, it should be understood that other applications involving a current steering cell may employ technology as described herein.

For a current steering DAC, an input digital code may steer current from an "on" or positive side to an "off" or negative side, and vice versa. A bleed network, such as provided with bleeder circuits 120-1 and 120-2 for example, may be active to reduce variability of charge or voltage of such parasitic capacitances during switching events. Effectively, by having such parasitic capacitances not appreciably change during switching events, output impedance may be enhanced with respect to converters that do not use a bleed network. This mitigation of voltage change, such as on output nodes 151 and 152 for example, may promote high-speed operation. Additionally, enhanced output impedance may enhance spectral performance, such as Spurious Free Dynamic Range ("SFDR") and Intermodulation Distortion ("IMD").

For a current steering DAC, number N of current steering cells 101-1 through 101-N may depend on a thermometer and/or binary segmentation, as well as resolution of such DAC and/or full scale current. During operation, current steering may be performed by switching positive-side and negative-side switching transistors 135 and 136. A cascode current source may be provided from cascode transistor 137 and current source transistor 138. Output cascodes may be obtained at output nodes 151 and 152. Bleed current through bleeder circuits 120-1 and 120-2 may be a small percentage of main current through current steering circuit 130. Along those lines, if a current source transistor 138 was 64 fingers, then each bleeder current source transistor 125-1 and 125-2 may be approximately 2 fingers. Along those lines, other transistors may be sized accordingly. As is known, transistors may be sized according to channel width W and channel length L. As current is steered from a positive side to a negative side, or vice versa, of a current steering cell 101-1 for example, bleeder circuits 120-1 and 120-2 may be used to hold switched capacitance associated with output cascodes and switched drains substantially constant to limit code dependent output impedance variation.

Current source transistors 138, bleed current source transistors 125-1 and 125-2, and bias diode transistor 142 may be located in a current source transistor array block 160 of a die. In general, transistors 138 and 142 may be in a same array for greater likelihood of matching one another. However, the number of elements used to provide transistors 142 and 138 may be different. For purposes of clarity by way of example and not limitation, transistor 142 may be 100 "fingers" in size for handling a current flow of approximately 1 mA, where a transistor 138 in each of current steering cells 101-1 through 101-N may have 10 fingers in sized for handling a current flow of approximately 100 uA flowing through each of transistors 138. Accordingly, a total current for all of transistors 138 may then be the full scale current of 100 uA multiplied by N in this example. Output circuit 110, switch transistors 135 and 136, bleeder switch transistors 123-1 and 123-2, cascode transistor 137, and bleeder cascode transistors 124-1 and 124-2 may be in a mixed signal block 170, separate from current source transistor array block 160, of such a die. Because current source transistor array block 160 may be sensitive to matching, and a mixed signal block 170 may be sensitive to interconnect parasitics, a division of these components may be used. This division may be for high frequency DACs, namely with an output of approximately 300 MHz or more for one or more output tones. However, for DACs operating in a DC domain or low frequency, transistors 124-1, 124-2, and 137 may all be co-located in a same current source array, such as current source array block 160.

Unfortunately, bleed current tracks main cell current, and such currents are not independently controlled from one another in current steering system 100. As reference current source 143 is adjusted, bleed and main currents scale accordingly. In an application, reference current source 143 may be varied for low frequency gain control. In this application, having bleed currents change in a scaled manner may make little, if any, difference. Additionally, in current steering system 100, bleed current source transistors 125-1 and 125-2 have the same W/L ratio as main current source transistors 138 of current steering cells 101-1 through 101-N, where only the number of fingers used is integer scaled. Even though a 2/1 ratio is mathematically equivalent to an 8/4 ratio transistor, an 8/4 sized transistor consumes more area than a 2/1 sized transistor. Furthermore, an 8/4 sized transistor may be more accurate and more precise than a 2/1 sized transistor. Therefore, the percentage of bleed current used directly translates into a concomitant die area, as fixed scaling is used for commonly biased transistors. For example, transistors 125-1 and 125-2 are sized the same as transistor 138, and transistor 138 is sized sufficiently large to provide precision and accuracy for a current steering DAC in this example. This means that current source transistors 125-1 and 125-2 are unduly large in area for bleeding current, as such accuracy and precision for a main current through a current steering circuit 130 is not needed for bleeding currents. Bleeding currents do not need to be as accurately controlled for current steering as a main current steering cell current.

As described below in additional detail, such above-described fixed scaling between bleed current through bleed circuits 120-1 and 120-2 and main current through current steering circuit 130 is broken to provide independent biasing of bleed and main current sources. Therefore, the area of bleed current resources can be made much smaller for a given current. Furthermore, bleed current resources may optionally be relocated out of a current source transistor array block 160 of a die, namely outside the body region associated with a main current source transistor array.

Along those lines, bleed current may be increased or decreased independent of main current. Furthermore, voltage change on the drains of current steering switches, such as transistors 135 and 136, during a current steering event may be reduced. Moreover, impedance and performance may be enhanced in current steering cell 101-1.

Figures 1, 2:
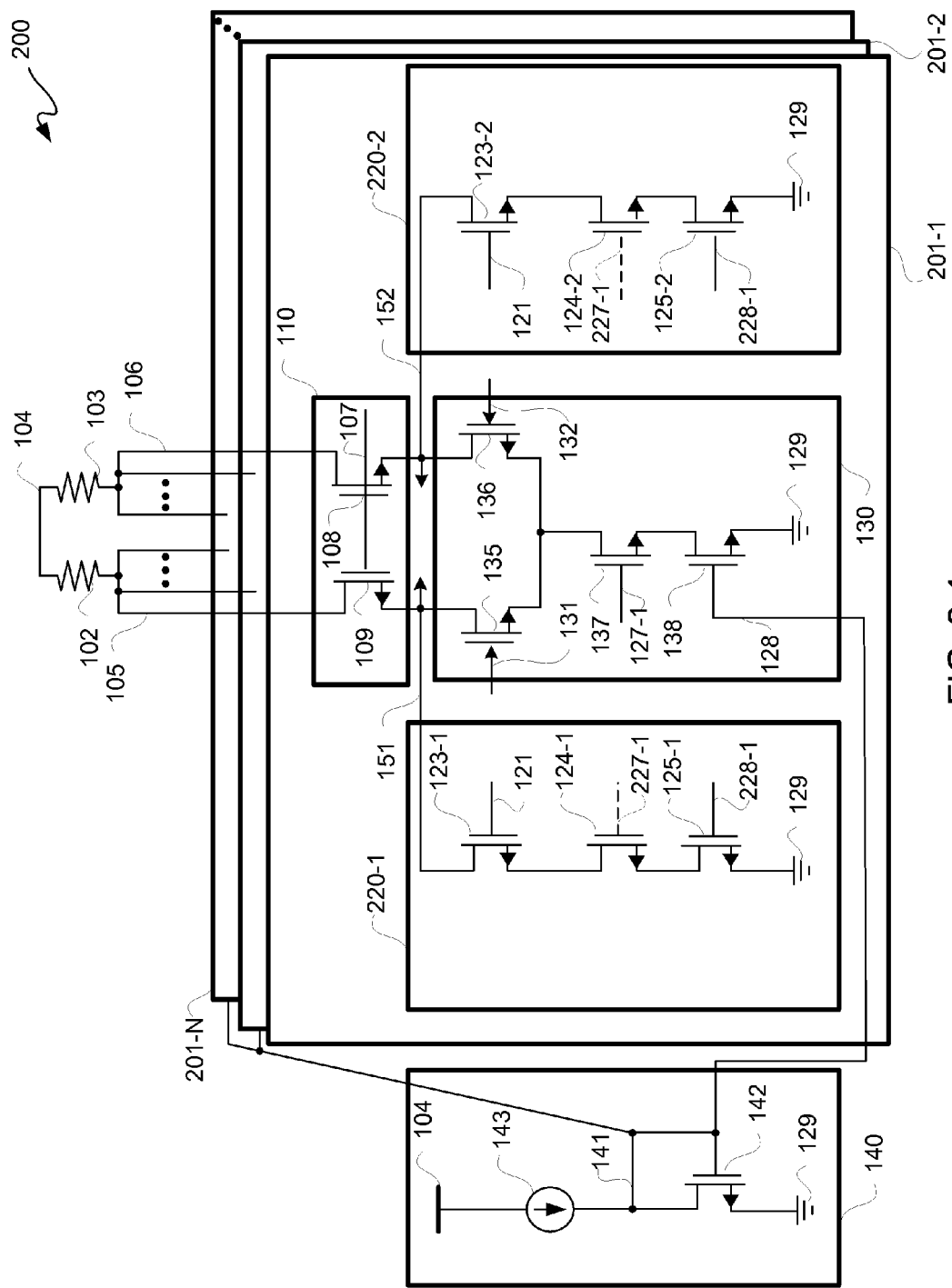
Figure 2:
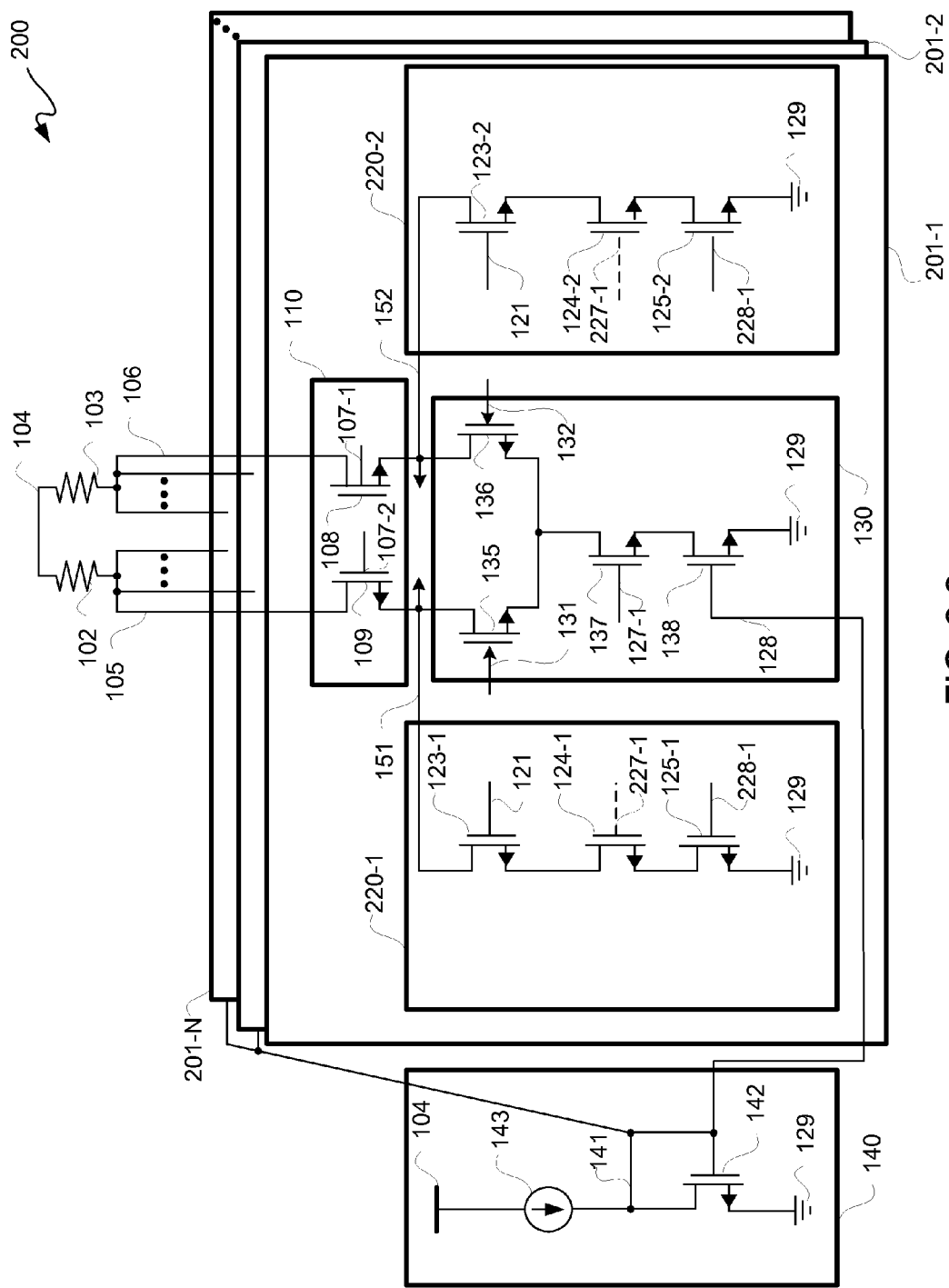

FIG. 2-1 is a block/circuit diagram depicting an exemplary current steering system 200. Current steering system 200 includes current steering cells 201-1 through 201-N (collectively and singly "201"). Current steering cells 201 correspond to current steering cells 101 of FIG. 1. Again, only n-type transistors, or more particularly NMOS transistors, are described for a single polarity current steering system 200; however, in other configuration other types of transistors may be used as previously described. Common description as between current steering systems 100 and 200 respectively of FIGS. 1 and 2-1 is generally not repeated for purposes of clarity. Additionally, FIG. 2-2 is a block/circuit diagram depicting another exemplary current steering system 200. In current steering system 200 of FIG. 2-2, NMOS transistors 108 and 109 are individually biased with corresponding separate output cascode bias voltages 107-1 and 107-2, respectively. However, for purposes of clarity and not limitation, current steering system 200 of FIG. 2-1 is described below herein.

Bleeder circuits 220-1 and 220-2, which correspond to bleeder circuits 120-1 and 120-2 of FIG. 1, are coupled to receive at least one bias voltage independent of at least one corresponding bias voltage provided to steering circuit 130 in contrast to bleeder circuits 120-1 and 120-2 of FIG. 1. In this example, steering circuit 130 is the same as in FIG. 1; however, current source transistors 125-1 and 125-2 respectively of bleeder circuits 220-1 and 220-2 are each gated with a bias voltage 228-1. There may be N separate bias voltages 228-N respectively for N current steering cells 201-N, or a there may be a single common bias voltage 228 for all N current steering cells 201. Current source transistor 138 of steering circuit 130 is coupled to receive a bias voltage 128 independent from bias voltage 228-1. Accordingly, additional current source supplies in addition to bias voltage generator 140 may be used, as described below in additional detail.

Because transistors 125-1 and 125-2 are independently biased from transistor 138 of a current steering cell 201-1 for example, bleed current, namely positive-side and negative-side bleed currents, may be controlled independently with respect to a main current through a channel of current source transistor 138. Optionally, bleeder cascode transistors 124-1 and 124-2 may be independently biased from main cell cascode transistor 137. Along those lines, bleeder cascode transistors 227-1 and 227-2 respectively of bleeder circuits 220-1 and 220-2 are each gated with a bias voltage 227-1. There may be N separate bias voltages 227-N respectively for N current steering cells 201-N, or a there may be a single common bias voltage 227 for all N current steering cells 201. Main cascode transistor 137 of steering circuit 130 is coupled to receive a bias voltage 127-1 independent from bias voltage 227-1.

Whilst approximately a percent ratio between bleed and main current was described above, a larger ratio may be used, such as approximately from approximately 10 to 20 percent depending on an application, by decoupling bleeder and main cell bias voltages as described below in additional detail. This allows for power savings or performance to be optimized. For power savings, bleeder circuits 220-1 and 220-2 may be turned off, such as by being decoupled from ground, when not in use or not needed for performance reasons. Additionally, by creating more die area due to having smaller bleeder transistors than before, larger main cell transistors may be formed to enhance precision and accuracy within a same die area as before. This duel capability may be a useful feature for reconfigurable Analog Mixed Signal ("AMS") integrated FPGA applications.

Cascode/current source bias nodes in a mixed signal block can be biased independently and/or the sizes of switch devices, such as transistors, can be optimized for a range of bias currents. A bleed current transistor W/L ratio and area/matching WL product may be sized differently as between main current steering and bleeder circuits. Current sources, such as current source 143 for example, may be programmable to provide a reference current. Even though NMOS transistors are illustratively depicted, generation of a reference current can be from a low resolution PMOS current source DAC. Enhanced performance may be obtained as a bleed current is increased with respect to a main cell current, as change in switch drain voltage may be reduced as current is steered. This may translate into increased output impedance, and therefore spectral performance may be enhanced.

Again, even though the description herein relates to NMOS current sink DACs, the description herein is applicable to PMOS current source DACs. Additionally, even though the description herein is for differential signaling, namely as described with positive and negative sides, the description herein is applicable to single ended signaling too. Thus, while differential signaling may be used to reduce distortion of even harmonics, including without limitation second order harmonic distortion, single-ended signaling may be used to reduce odd order harmonic distortion. For example, single-ended current source or current sink DACs may employ decoupling of bleeder and main current source and/or cascode gating voltage biases as described herein. Because spectral performance may be enhanced as described herein, a current steering DAC as described herein may be used for a transmitter, such as for example a PAM-4 or other form of amplitude modulation configured transmitter, and thus a current steering DAC as described herein may be used in a Serializer-Deserializer ("SerDes") system.

Accordingly, it should be appreciated that independent biasing of bleed currents through transistors 125-1 and 125-2 with respect to main currents through transistors 138 may be employed.

Figure 3:
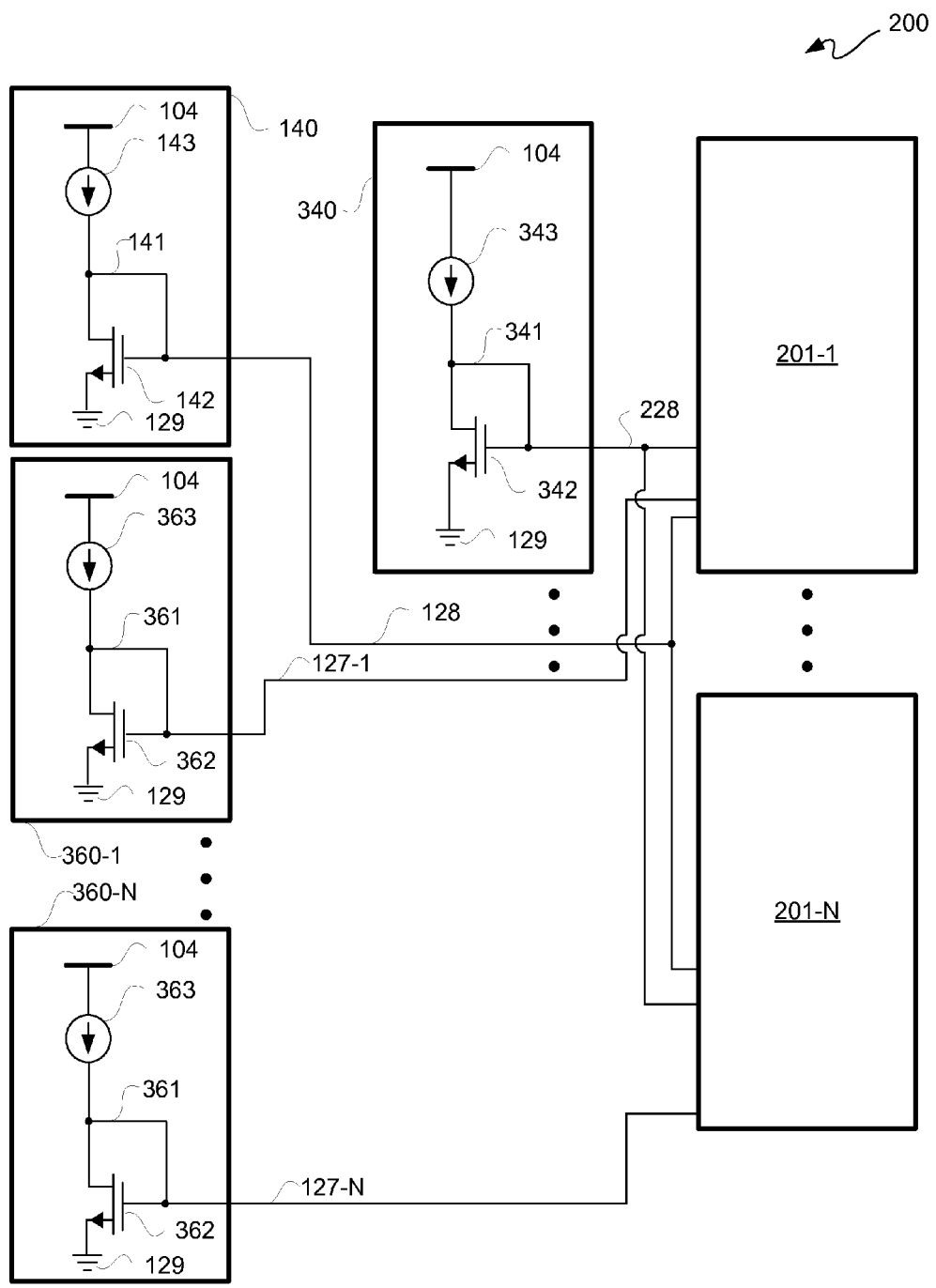
FIG. 3 is a block/circuit diagram depicting an exemplary current steering system for a common current-source bias voltage.

FIG. 3 is a block/circuit diagram depicting another exemplary current steering system 200 for a common bias voltage 228. Common description as between current steering systems 200 of FIGS. 2-1 and 3 is generally not repeated for purposes of clarity.

Current steering system 200 of FIG. 3 includes bias voltage generator 140, current steering cells 201-1 through 201-N, bias voltage generator 340, and bias voltage generators 360-1 through 360-N (collectively and singly "360"). Thus, generally, a plurality of current sources provided by bias voltage generators 140, 340, and 360 are coupled to a plurality of current steering cells 201, as described below in additional detail. Bias voltage generator 140 is commonly coupled to current source transistors 138 of corresponding current steering circuits 130 of current steering cells 201, as previously described with reference to FIG. 1.

Bias voltage generator 340 may include a reference current source 343 coupled between a supply voltage node or bus 104 and a bias voltage output node 341. A drain node of NMOS transistor 342 of bias voltage generator 340 may be coupled to bias voltage output node 341. A source node of NMOS transistor 342 may be coupled to a ground node or bus 129. A gate of NMOS transistor 342 is likewise coupled to bias voltage output node 341, and bias voltage output node 341 is coupled to gates of bleeder current source bias voltage transistors 125-1 and 125-2 of each cell of current steering cells 201-1 through 201-N. Bias voltage 228 may be sourced from voltage output node 341 for commonly gating bleeder current source transistors 125-1 and 125-2 of each cell of current steering cells 201-1 through 201-N. NMOS transistor 342 is a diode coupled transistor to provide a bias diode transistor. Current passing through transistor 342 may thus be mirrored in bleeder current source transistors 125-1 and 125-2 of each cell of current steering cells 201-1 through 201-N.

Bias voltage generators 360-1 through 360-N may each include a reference current source 363 coupled between a supply voltage node or bus 104 and a bias voltage output node 361. For example, a drain node of NMOS transistor 362 of bias voltage generator 360-1 may be coupled to bias voltage output node 361, as in each of bias voltage generators 360-1 through 360-N. In each of bias voltage generators 360-1 through 360-N, a source node of NMOS transistor 362 may be coupled to a ground node or bus 129, and a gate of NMOS transistor 362 may likewise be coupled to bias voltage output node 361. NMOS transistor 362 is a diode coupled transistor to provide a bias diode transistor.

Bias voltage output nodes 361 of bias voltage generators 360-1 through 360-N may respectively be coupled to current steering cells 201-1 through 201-N. Bias voltages 127-1 through 127-N may be respectively sourced from voltage output nodes 361 of bias voltage generators 360-1 through 360-N for gating corresponding bleeder cascode transistors 124-1, 124-2, and 137 of each cell of current steering cells 201-1 through 201-N as described with reference to FIG. 1. Current passing through respective transistors 362 may thus be correspondingly mirrored in bleeder cascode transistors 124-1, 124-2 and 137 of each cell of current steering cells 201-1 through 201-N.

Figure 4:
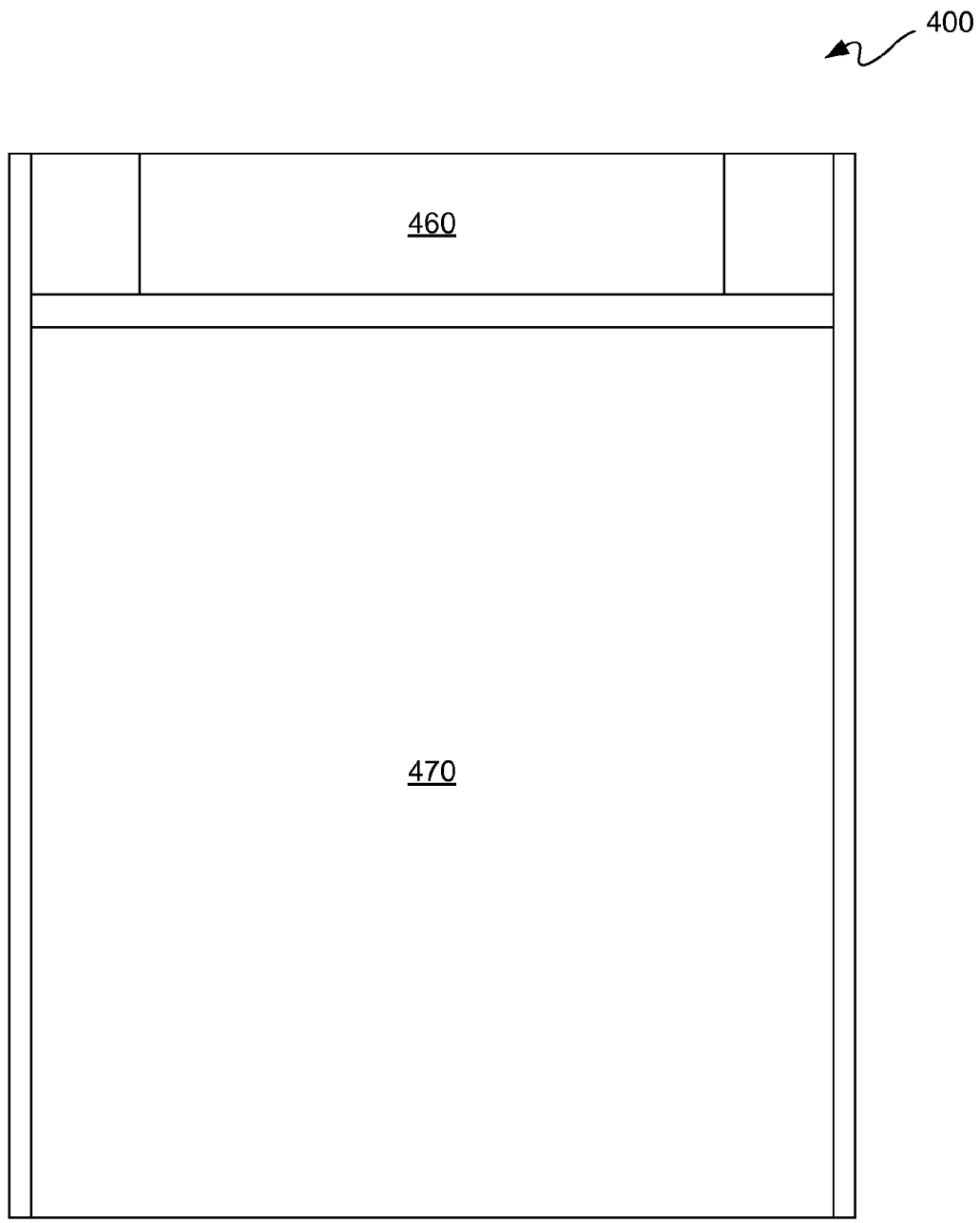
FIG. 4 is a block diagram depicting an exemplary embodiment of a die having a plurality of layout regions.

FIG. 4 is a block diagram depicting an exemplary embodiment of a die 400 having a plurality of layout regions. Layout region 460 may be a mixed signal block for output cascode transistors, switch transistors, and cascode transistors of both a main steering circuit 130 and bleeder circuits 220-1 and 220-2 of current steering cells 100, such as previously described. Layout region 470 may be a current source transistor array block for current source transistors of both a main steering circuit and bleeder circuits of current steering cells, such as previously described.

Figure 5:
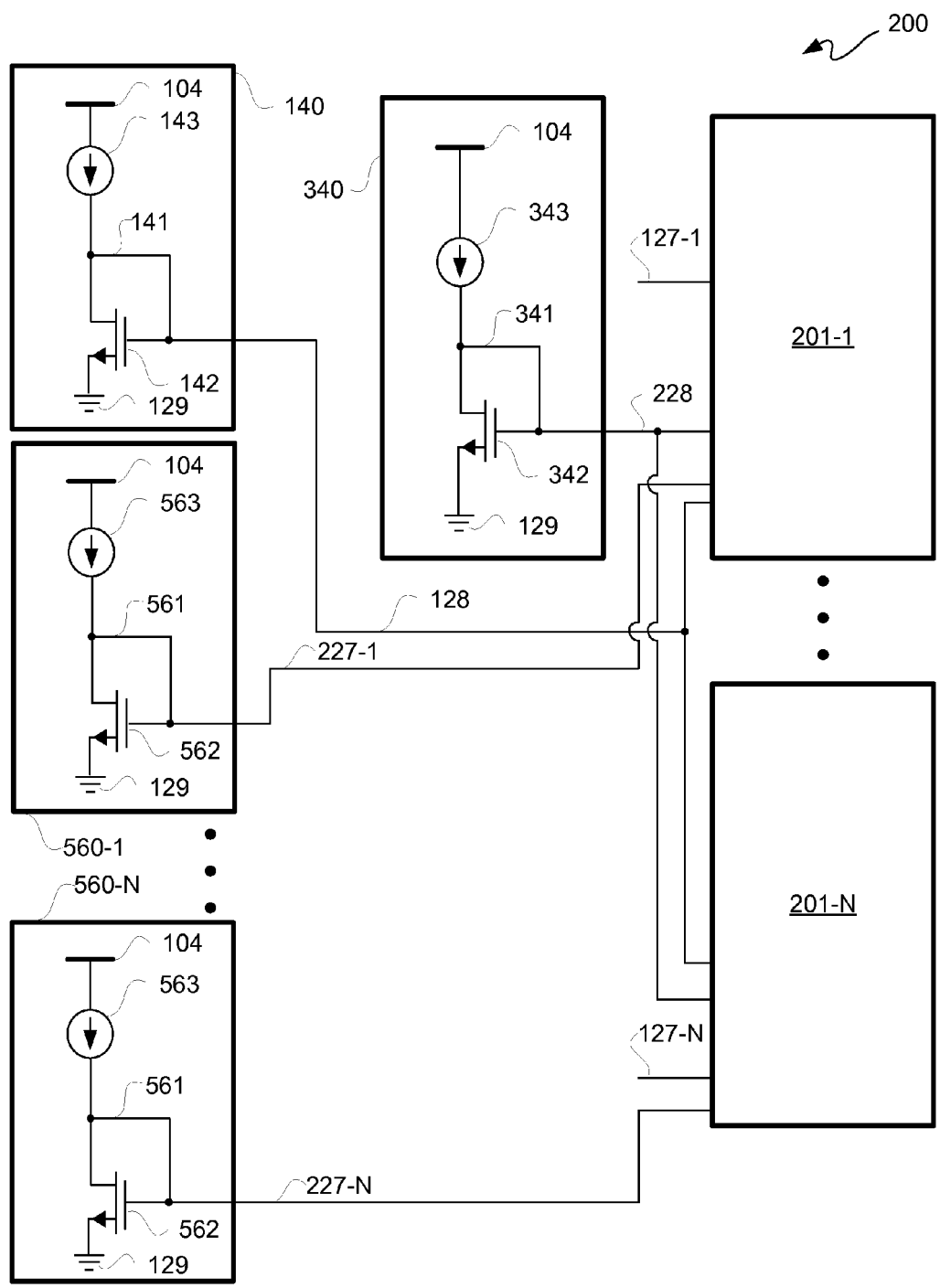
FIG. 5 is a block/circuit diagram depicting another exemplary current steering system for a common current-source bias voltage.

FIG. 5 is a block/circuit diagram depicting yet another exemplary current steering system 200 for a common bias voltage 228. Common description as between current steering systems 200 of FIGS. 2-1, 3 and 5 is generally not repeated for purposes of clarity.

Current steering system 200 of FIG. 5 includes bias voltage generator 140, current steering cells 201-1 through 201-N, bias voltage generator 340, bias voltage generators 360 (though not shown in FIG. 5 as detailed in FIG. 3), and bias voltage generators 560-1 through 560-N (collectively and singly "560"). Thus, generally, a plurality of current sources provided by bias voltage generators 140, 340, 360, and 560 are coupled to a plurality of current steering cells 201, as described below in additional detail. Bias voltage generators 140 and 340 are coupled to current steering cells 201, as previously described with reference to FIGS. 2-1 and 3. Along those lines, bias voltage 228 is commonly sourced from node 341 as previously described with reference to FIG. 3.

Bias voltages 127-1 through 127-N may be respectively sourced from voltage output nodes 361 of bias voltage generators 360-1 through 360-N for gating cascode transistors 137 of each cell of current steering cells 201-1 through 201-N as described with reference to FIGS. 2-1 and 3. Current respectively passing through transistors 362 may thus be mirrored in corresponding cascode transistors 137 of each cell of current steering cells 201-1 through 201-N.

Bias voltage generators 560-1 through 560-N may each include a reference current source 563 coupled between a supply voltage node or bus 104 and a bias voltage output node 561. For example, a drain node of NMOS transistor 562 of bias voltage generator 560-1 may be coupled to bias voltage output node 561, as in each of bias voltage generators 560-1 through 560-N. In each of bias voltage generators 560-1 through 560-N, a source node of NMOS transistor 562 may be coupled to a ground node or bus 129, and a gate of NMOS transistor 562 may likewise be coupled to bias voltage output node 561. NMOS transistor 562 is a diode coupled transistor to provide a bias diode transistor.

Bias voltage output nodes 561 of bias voltage generators 560-1 through 560-N may respectively be coupled to current steering cells 201-1 through 201-N. Bias voltages 227-1 through 227-N may be respectively sourced from voltage output nodes 561 of bias voltage generators 560-1 through 560-N for gating corresponding bleeder cascode transistors 124-1 and 124-2 of each cell of current steering cells 201-1 through 201-N. Current respectively passing through transistors 562 may thus be mirrored in corresponding bleeder cascode transistors 124-1 and 124-2 of each cell of current steering cells 201-1 through 201-N.

In this example, bleeder currents associated with passing through bleeder current source transistors are independent of a main current passing through main current source transistors. Furthermore, in this example, bleeder currents associated with passing through bleeder cascode transistors are independent of a main current passing through main cascode transistors.

Figure 6:
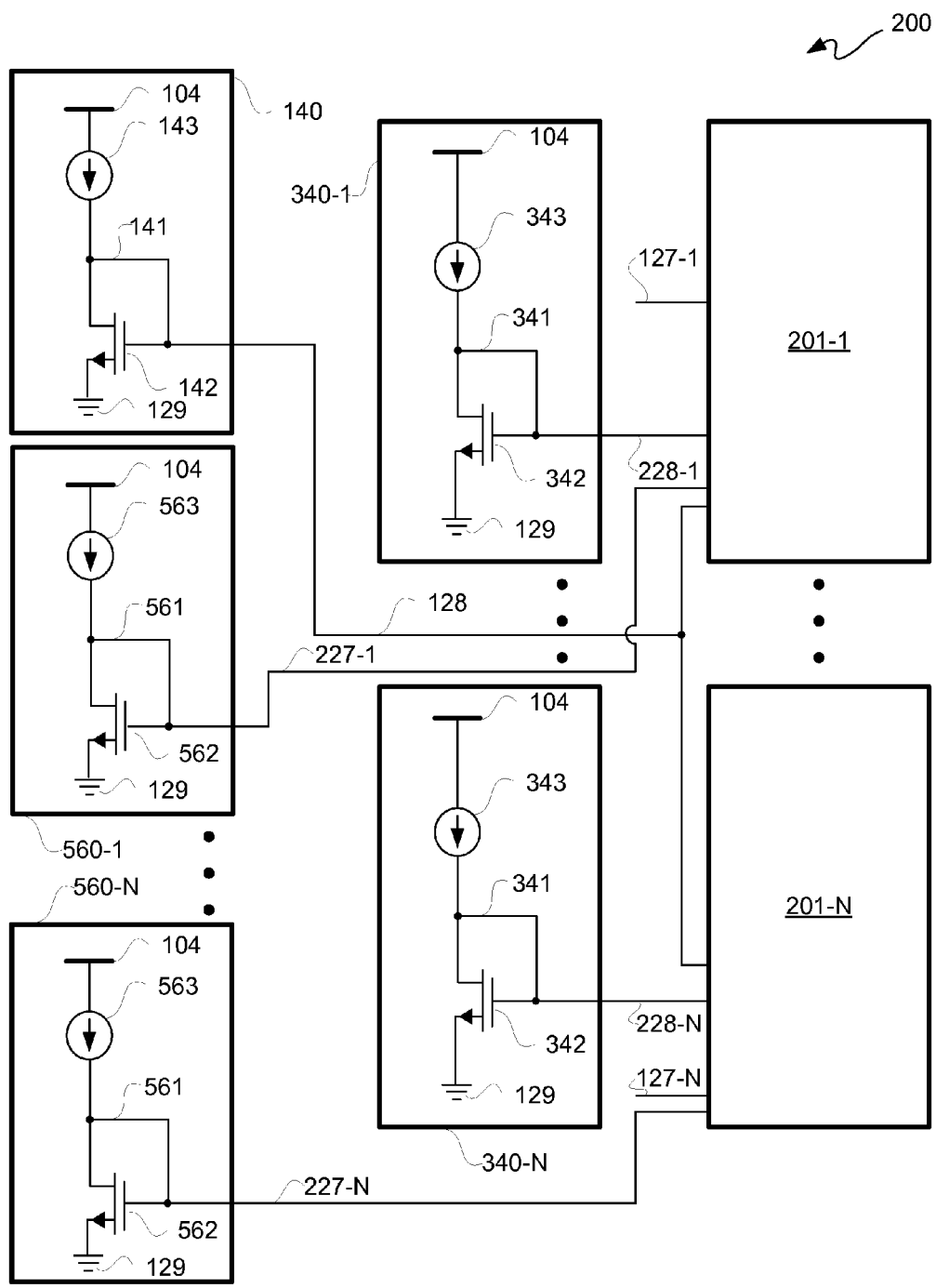
FIG. 6 is a block/circuit diagram depicting exemplary current steering system for a plurality of current-source bias voltages.

FIG. 6 is a block/circuit diagram depicting exemplary current steering system 200 for a plurality of bias voltages 228-1 through 228-N. Common description as between current steering systems 200 of FIGS. 2-1, 3, 5, and 6 is generally not repeated for purposes of clarity.

Current steering system 200 of FIG. 6 includes bias voltage generator 140, current steering cells 201-1 through 201-N, bias voltage generators 340-1 through 340-N (collectively and singly "340"), bias voltage generators 360 (though not shown in FIG. 6 as detailed in FIG. 3), and bias voltage generators 560. Thus, generally, a plurality of current sources provided by bias voltage generators 140, 340-1 through 340-N, 360, and 560 are coupled to a plurality of current steering cells 201, as described below in additional detail.

Bias voltage generator 140 is coupled to current steering cells 201, as previously described with reference to FIG. 2-1. Bias voltages 127-1 through 127-N may be respectively sourced from voltage output nodes 361 of bias voltage generators 360-1 through 360-N for gating cascode transistors 137 of each cell of current steering cells 201-1 through 201-N as described with reference to FIGS. 2-1 and 3. Bias voltages 227-1 through 227-N may be respectively sourced from voltage output nodes 561 of bias voltage generators 560-1 through 560-N for gating bleeder cascode transistors 124-1 and 124-2 of each cell of current steering cells 201-1 through 201-N, as previously described with reference to FIG. 5.

However, in this example, bias voltages 228-1 through 228-N are respectively sourced from nodes 341 of corresponding bias voltage generators 340-1 through 340-N, as previously described with reference to FIG. 3 and described below in additional detail.

Bias voltage generators 340-1 through 340-N may each include a reference current source 343 coupled between a supply voltage node or bus 104 and a bias voltage output node 341. For example, a drain node of NMOS transistor 342 of bias voltage generator 340-1 may be coupled to bias voltage output node 341, as in each of bias voltage generators 340-1 through 340-N. In each of bias voltage generators 340-1 through 340-N, a source node of NMOS transistor 342 may be coupled to a ground node or bus 129, and a gate of NMOS transistor 342 may likewise be coupled to bias voltage output node 341. NMOS transistor 342 is a diode coupled transistor to provide a bias diode transistor.

Bias voltage output nodes 341 of bias voltage generators 340-1 through 340-N may respectively be coupled to current steering cells 201-1 through 201-N. Bias voltages 228-1 through 228-N may be respectively sourced from voltage output nodes 341 of bias voltage generators 340-1 through 340-N for gating corresponding bleeder current source transistors 125-1 and 125-2 of each cell of current steering cells 201-1 through 201-N. Current respectively passing through transistors 342 may thus be correspondingly mirrored in bleeder current source transistors 125-1 and 125-2 of each cell of current steering cells 201-1 through 201-N, with a scaling factor as previously described with reference to transistors 138 and 142 likewise applies to transistor 342 and bias voltage 228. However, such scaling factor does not apply to transistors 562 for current source cascode transistor 137 for generating a bias voltage for a cascode.

In this example, bleeder currents associated with passing through bleeder current source transistors are independent of a main current passing through main current source transistors and are respectively provided to be independent of one another. This may be used to facilitate additional trimming or tuning for timing adjustments. Furthermore, in this example, bleeder currents associated with passing through bleeder cascode transistors are independent of a main current passing through main cascode transistors.

Figure 7:
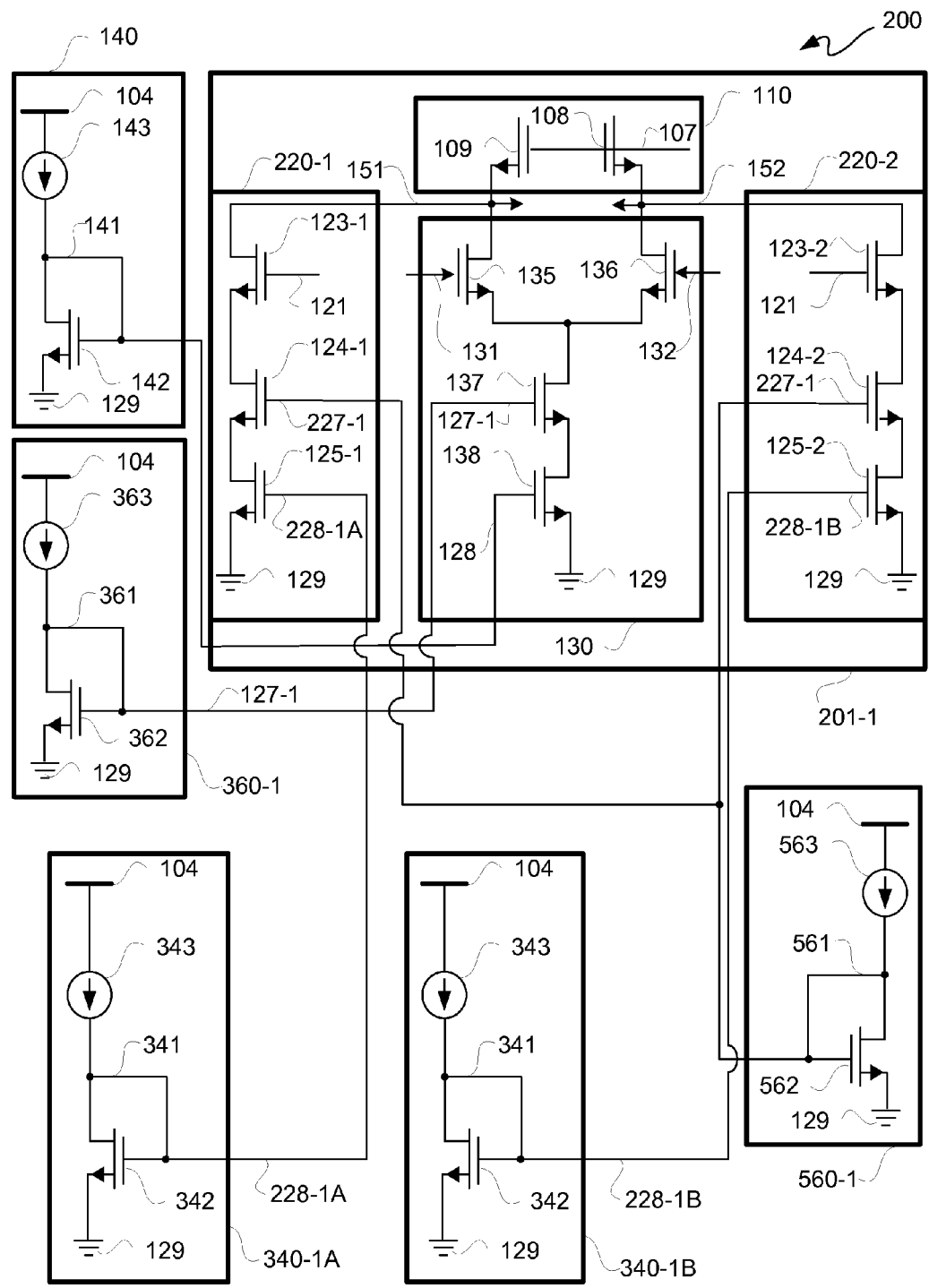
FIG. 7 is a block/circuit diagram depicting another exemplary current steering system for a plurality of current-source bias voltages.

FIG. 7 is a block/circuit diagram depicting another exemplary current steering system 200 for bias voltages 228-1A through 228-1B provided to a same current steering cell 201-1. Common description as between current steering systems 200 of FIGS. 2-1, 3, 5, 6, and 7 is generally not repeated for purposes of clarity.

Current steering system 200 of FIG. 7 includes bias voltage generator 140, a current steering cell 201-1, bias voltage generators 340-1A and 340-1B, and bias voltage generators 360-1 and 560-1. Thus, generally, a plurality of bias voltages may be provided by bias voltage generators 140, 340-1A and 340-1B, 360-1, and 560-1 as coupled to a current steering cell 201-1, as described below in additional detail. However, it should be understood that a plurality of current steering cells 201 may be coupled to receive such bias voltages, along the lines previously described.

Bias voltage generator 140 is coupled to current steering cell 201-1, as previously described with reference to FIG. 2-1. Bias voltage 227-1 may be sourced from a voltage output node 561 of a bias voltage generator 560-1 for a bias voltage applied to gates of cascode transistors 124-1 and 124-2 of current steering cell 201-1 as described with reference to FIGS. 2-1 and 5. Bias voltage 127-1 may be sourced from a voltage output node 361 of a bias voltage generator 360-1 for a bias voltage applied to a gate of cascode transistor 137. Bias voltages 228-1A and 228-1B are respectively sourced from nodes 341 of corresponding bias voltage generators 340-1A and 340-1B. In this example, current source transistors 125-1 and 125-2 of a same current steering cell 201-1 may be independently biased by separate bias voltages 228-1A and 228-1B respectively applied to gates of such transistors. By biasing bleeder current transistors separately, timing within current steering cell 201-1, as well as between current steering cells 201 may be adjusted. As adjustments in currents may be small, a same bias voltage 127-1, or a same bias voltage 227, may be provided to cascode transistors without affecting significantly bleeder cascode bias.

In this example, bleeder currents associated with passing through bleeder current source transistors are independent of a main current passing through main current source transistors and are respectively provided to be independent of one another. This may be used to facilitate additional trimming or tuning for timing adjustments, and such timing adjustments may be on a per cell basis differentially. Also, in this example, bleeder current sources associated with passing through bleeder cascode transistors 124-1 and 124-2 are independent of, namely are not dependent with, a main current passing through main cascode transistors 137.

With reference to FIGS. 1 through 7, layout region 460 may be a mixed signal block for output cascode transistors, switch transistors, and cascode transistors of both a main steering circuit 130 and bleeder circuits 220-1 and 220-2 of current steering cells 100, such as previously described. However, where bleeder current source transistors, as well as associated bias diode transistors of corresponding voltage generators, are biased independently from main cell current source transistors, then such bleeder current source transistors may be included in layout region 460.

Accordingly, a layout region 470 in an embodiment may include only current source transistors 138 in a current source transistor array block. Generally, layout region 470 has been substantially larger than layout region 460 due to sizing of current source transistors for example. Additional area may be created in layout region 470 by the above-described decoupling of biasing of bleeder circuit transistors with respect to corresponding steering circuit transistors, as such decoupled biased bleeder circuit transistors may be formed substantially smaller than corresponding steering circuit transistors.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 8:
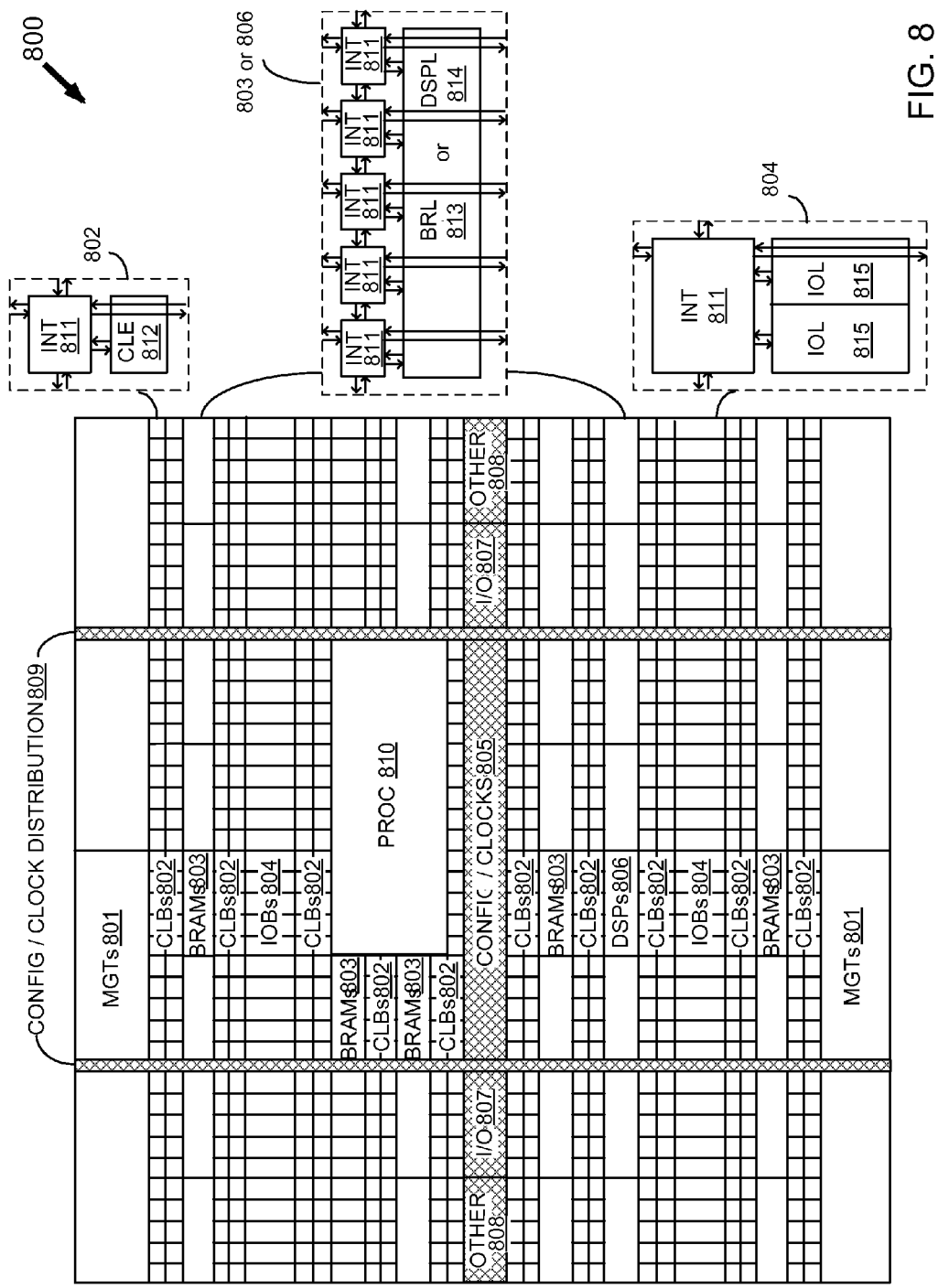
FIG. 8 is a simplified block diagram depicting an exemplary columnar Field Programmable Gate Array ("FPGA") architecture.

As noted above, advanced FPGAs can include several different types of programmable logic blocks in the array. For example, FIG. 8 illustrates an FPGA architecture 800 that includes a large number of different programmable tiles including multi-gigabit transceivers ("MGTs") 801, configurable logic blocks ("CLBs") 802, random access memory blocks ("BRAMs") 803, input/output blocks ("IOBs") 804, configuration and clocking logic ("CONFIG/CLOCKS") 805, digital signal processing blocks ("DSPs") 806, specialized input/output blocks ("I/O") 807 (e.g., configuration ports and clock ports), and other programmable logic 808 such as digital clock managers, analog-to-digital converters, system monitoring logic, and so forth. Some FPGAs also include dedicated processor blocks ("PROC") 810.

In some FPGAs, each programmable tile includes a programmable interconnect element ("INT") 811 having standardized connections to and from a corresponding interconnect element in each adjacent tile. Therefore, the programmable interconnect elements taken together implement the programmable interconnect structure for the illustrated FPGA. The programmable interconnect element 811 also includes the connections to and from the programmable logic element within the same tile, as shown by the examples included at the top of FIG. 8.

For example, a CLB 802 can include a configurable logic element ("CLE") 812 that can be programmed to implement user logic plus a single programmable interconnect element ("INT") 811. A BRAM 803 can include a BRAM logic element ("BRL") 813 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 806 can include a DSP logic element ("DSPL") 814 in addition to an appropriate number of programmable interconnect elements. An IOB 804 can include, for example, two instances of an input/output logic element ("IOL") 815 in addition to one instance of the programmable interconnect element 811. As will be clear to those of skill in the art, the actual I/O pads connected, for example, to the I/O logic element 815 typically are not confined to the area of the input/output logic element 815.

In the pictured embodiment, a horizontal area near the center of the die (shown in FIG. 8) is used for configuration, clock, and other control logic. Vertical columns 809 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, processor block 810 spans several columns of CLBs and BRAMs.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
a current steering cell;
wherein the current steering cell includes a first bleeder circuit, a second bleeder circuit, a steering circuit, and an output circuit;
wherein the first bleeder circuit and the second bleeder circuit are coupled to receive a first current-source bias voltage;
wherein the steering circuit is coupled to receive a second current-source bias voltage independent from the first current-source bias voltage;
wherein the current steering cell has a plurality of current steering cells including the current steering cell; and
wherein:
the first bleeder circuit and the second bleeder circuit of each of the plurality of current steering cells are coupled to respectively receive a plurality of first bias cascode voltages; and
the steering circuit of each of the plurality of current steering cells is coupled to respectively receive a plurality of second bias cascode voltages independent from the plurality of first bias cascode voltages.

2. The apparatus according to claim 1, wherein:
the first bleeder circuit and the second bleeder circuit are coupled to receive a first bias cascode voltage; and
the steering circuit is coupled to receive a second bias cascode voltage independent from the first bias cascode voltage.

3. The apparatus according to claim 2, wherein:
the first bleeder circuit and the second bleeder circuit are coupled to receive a bias switch voltage; and
the steering circuit is coupled to receive a positive-side data signal and a negative-side data signal.

4. The apparatus according to claim 3, wherein:
the first bleeder circuit, the steering circuit, and the output circuit are commonly coupled at a positive-side output node; and
the first bleeder circuit, the steering circuit, and the output circuit are commonly coupled at a negative-side output node.

5. The apparatus according to claim 4, wherein the current steering cell is of a single polarity.

6. The apparatus according to claim 3, wherein:
each of the plurality of current steering cells includes a respective one of each of the first bleeder circuit, the second bleeder circuit, the steering circuit, and the output circuit;
the first bleeder circuit and the second bleeder circuit of each of the plurality of current steering cells are coupled to receive a first common current-source bias voltage; and
the steering circuit of each of the plurality of current steering cells is coupled to receive a second common current-source bias voltage independent from the first common current-source bias voltage.

7. An apparatus, comprising:

a plurality of current steering cells coupled to a plurality of current source supplies;

wherein the plurality of current source supplies include a first bias voltage generator and a second bias voltage generator;

wherein each of the plurality of current steering cells includes a first bleeder circuit, a second bleeder circuit, a steering circuit, and an output circuit;

wherein the first bleeder circuit and the second bleeder circuit of each of the plurality of current steering cells is coupled to receive a first common current-source bias voltage from the first bias voltage generator;

wherein the steering circuit of each of the plurality of current steering cells is coupled to receive a second common current-source bias voltage from the second bias voltage generator; and wherein:
- the first bleeder circuit and the second bleeder circuit of each of the plurality of current steering cells are coupled to respectively receive a plurality of first bias cascode voltages; and
- the steering circuit of each of the plurality of current steering cells is coupled to respectively receive a plurality of second bias cascode voltages independent from the plurality of first bias cascode voltages.

8. The apparatus according to claim 7, wherein the first bleeder circuit, the second bleeder circuit and the steering circuit of each of the plurality of current steering cells are coupled to respectively receive a plurality of bias cascode voltages.

9. The apparatus according to claim 7, wherein the current steering cell is of a single polarity.

10. The apparatus according to claim 9, wherein the single polarity is for n-type transistors.

* * * * *